(12) United States Patent
Judson et al.

(10) Patent No.: US 8,538,367 B2
(45) Date of Patent: Sep. 17, 2013

(54) BUFFER CIRCUIT WITH INTEGRATED LOSS CANCELING

(75) Inventors: Bruce A. Judson, San Diego, CA (US); Cong T. Nguyen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1115 days.

(21) Appl. No.: 12/493,568

(22) Filed: Jun. 29, 2009

(65) Prior Publication Data
US 2010/0330948 A1 Dec. 30, 2010

(51) Int. Cl.
*H04B 1/16* (2006.01)

(52) U.S. Cl.
USPC ............ 455/334; 455/307; 455/323; 333/175

(58) Field of Classification Search
USPC .............. 455/307, 323, 334, 339–341, 550.1; 333/172–175
See application file for complete search history.

(56) References Cited

U.S. PATENT DOCUMENTS

| | | | |
|---|---|---|---|
| 5,451,915 A | 9/1995 | Katzin et al. | |
| 5,502,803 A | 3/1996 | Yoshida et al. | |
| 5,528,263 A | 6/1996 | Platzker et al. | |
| 5,550,520 A * | 8/1996 | Kobayashi | 333/213 |
| 5,712,658 A | 1/1998 | Arita et al. | |
| 5,835,078 A | 11/1998 | Arita et al. | |
| 6,188,388 B1 | 2/2001 | Arita et al. | |
| 6,219,034 B1 | 4/2001 | Elbing et al. | |
| 6,260,973 B1 | 7/2001 | Minato et al. | |
| 6,272,245 B1 | 8/2001 | Lin | |
| 6,346,933 B1 | 2/2002 | Lin | |
| 6,417,841 B1 | 7/2002 | Doi et al. | |
| 6,542,087 B2 | 4/2003 | Lin | |
| 6,802,611 B2 | 10/2004 | Chu et al. | |
| 6,803,906 B1 | 10/2004 | Morrison et al. | |

(Continued)

FOREIGN PATENT DOCUMENTS

| EP | 1087327 A2 | 3/2001 |
|---|---|---|
| EP | 1879129 A1 | 1/2008 |

(Continued)

OTHER PUBLICATIONS

Kuhn, et al., "Q-Enhanced LC Bandpass Filters for Integrated Wireless Applications", IEEE Transactions on Microwave Theory and Techniques, vol. 46, No. 12, pp. 2577-2586, Dec. 1998.

(Continued)

*Primary Examiner* — Nhan Le
(74) *Attorney, Agent, or Firm* — Ramin Mobarhan

(57) ABSTRACT

A filter circuit enhances a deficient Q-value in a filter stage and buffers the filter stage from subsequent filter stages using a common active device. A filter circuit includes a first buffered filtering stage including a first Q-deficient filter stage to receive an input signal and a first Q-enhancement buffer stage. The first Q-enhancement buffer stage is coupled to the first Q-deficient filter stage, wherein the first Q-enhancement buffer stage includes a single active device to increase a Q-value of the first Q-deficient filter stage and isolate the first Q-deficient filter stage from any subsequent filter stage. A filtering method includes filtering an input signal in a first Q-deficient filter stage and enhancing a deficient Q-value of the first Q-deficient filter stage with an active device. The method further includes buffering the first Q-deficient filter stage from any subsequent filter stage with the active device.

20 Claims, 7 Drawing Sheets

(56) References Cited

U.S. PATENT DOCUMENTS

| | | |
|---|---|---|
| 7,410,260 B2 | 8/2008 | Mehrl |
| 7,420,540 B2 | 9/2008 | Olbrich |
| 7,539,471 B2 * | 5/2009 | Zhan et al. .................. 455/130 |
| 7,559,656 B2 | 7/2009 | Yumiki et al. |
| 7,862,179 B2 | 1/2011 | Shan et al. |
| 8,237,509 B2 | 8/2012 | Kim et al. |
| 2001/0030668 A1 | 10/2001 | Erten et al. |
| 2003/0076293 A1 | 4/2003 | Mattsson |
| 2005/0151850 A1 | 7/2005 | Ahn et al. |
| 2005/0212760 A1 | 9/2005 | Marvit et al. |
| 2006/0038610 A1 * | 2/2006 | Gudem et al. ................ 327/552 |
| 2006/0141957 A1 | 6/2006 | Fischer et al. |
| 2006/0238493 A1 | 10/2006 | Dunton |
| 2007/0143715 A1 | 6/2007 | Hollins et al. |
| 2007/0236451 A1 | 10/2007 | Ofek et al. |
| 2008/0120576 A1 | 5/2008 | Kariathungal et al. |
| 2008/0180395 A1 | 7/2008 | Gray |
| 2009/0051671 A1 | 2/2009 | Konstas |
| 2009/0115721 A1 | 5/2009 | Aull et al. |
| 2009/0132926 A1 | 5/2009 | Bucha |
| 2009/0190046 A1 | 7/2009 | Kreiner et al. |
| 2009/0217210 A1 | 8/2009 | Zheng et al. |
| 2009/0273575 A1 | 11/2009 | Pryor |
| 2010/0027843 A1 | 2/2010 | Wilson |
| 2010/0289743 A1 | 11/2010 | Sun et al. |
| 2011/0119638 A1 | 5/2011 | Forutanpour |
| 2011/0230238 A1 | 9/2011 | Aronsson et al. |

FOREIGN PATENT DOCUMENTS

| | | |
|---|---|---|
| JP | 2004178469 A | 6/2004 |
| WO | WO 2006011100 A1 | 2/2006 |
| WO | WO 2008014819 A1 | 2/2008 |

OTHER PUBLICATIONS

Georgescu B, et al., "Tunable coupled inductor Q-enhancement for parallel resonant LC tanks" IEEE Transactions on Circuits and Systems II: Express Briefs, IEEE Service Center, New York, NY, US LNKD-DOI: 10.1109/TCSII.2003.818366, vol. 50, No. 10, Oct. 1, 2003, pp. 705-713, XP011102481, ISSN: 1057-7130.

International Search Report and Written Opinion—PCT/US2010/040487—International Search Authority, European Patent Office, Dec. 13, 2010.

Pipilos S, et al., "RLC active filters with electronically tunable centre frequency and quality factor", Electronics Letters, IEE Stevenage, GB LNKD-DOI:10.1049/EL:19940323, vol. 30, No. 6, Mar. 17, 1994, pp. 472-474, XP006000316, ISSN: 0013-5194 the whole document.

Hisamatsu T., et al., "A novel click-free interraction techinique for large-screen interfaces", 2006.

Kim N.W., et al., "Vision based laser pointer interaction for flexible screens", 2007.

Kuhn W.B. et al., "A 200 MHz CMOS Q-enhanced LC bandpass filter", IEEE Journal of Solid-State Circuits, Aug. 1996, pp. 1112-1122, vol. 31, No. 8.

Taiwan Search Report—TW099121266—TIPO—Jan. 31, 2013.

Wu Chung-Yu et al., "The design of a 3-V 900-MHz CMOS bandpass amplifier," IEEE Journal of Solid-State Circuits, Feb. 1997, vol. 32, No. 2, pp. 159-168.

\* cited by examiner

BUFFER CIRCUIT WITH INTEGRATED LOSS CANCELING

BACKGROUND

I. Field

The present disclosure relates generally to circuits, and more specifically to filter stage buffers.

II. Background

Filters are commonly used in various electronics devices to provide signal selection. Different types of filters are available for different uses. For example, a wireless device such as a cellular phone may include a transmitter and a receiver for bi-directional communication. The transmitter may utilize a power amplifier (PA), the receiver may utilize a low noise amplifier (LNA), and the transmitter and receiver may utilize variable gain amplifiers (VGAs). The transmitter and receiver may each include filters for selection of desired signals and for attenuation of undesired signals. Filters may be active or passive filters and may be single or multiple order filters. For multiple order filters, each filter stage is coupled, i.e., operatively buffered or isolated, to other stages allowing each stage to perform a transfer function on the input signal in order to generate the desired response exhibited on the output signal.

High volume manufacturing techniques and the demand for size reduction results in filter with lower 'Q-values. Accordingly, techniques for improving the Q-value become necessary to achieve the necessary overall filter performance. To achieve a multiple pole filter, the interaction between individual poles need to be specifically set using coupling or buffering techniques in order to prevent the individual pole circuits from forming a single lumped element filter.

The techniques for improving the Q-value of the filter stages and the filter-pole separating buffers each draw typically require significant power. Power consumption is a critical issue for battery operated devices, such as cell phones. Therefore, there is a need in the art for a improving the Q-value of a filter and providing coupling between the filter stages while minimizing power consumption.

SUMMARY

Embodiments disclosed herein address the above stated needs by providing a Q-enhancement buffer stage configured to provide both Q-enhancement to a Q-deficient filter stage and buffering between any subsequent filter stages, or output of the filter, using a common active device. In one aspect of the disclosed embodiments, a filter circuit includes a first buffered filtering stage including a first Q-deficient filter stage to receive an input signal and a first Q-enhancement buffer stage. The first Q-enhancement buffer stage is coupled to the first Q-deficient filter stage, wherein the first Q-enhancement buffer stage includes a single active device to increase a Q-value of the first Q-deficient filter stage and isolate the first Q-deficient filter stage from any subsequent filter stage.

In another aspect of the disclosed embodiments, a filter circuit includes a first Q-deficient filter stage a second filter stage. The filter further includes a first Q-enhancement buffer stage coupled therebetween with the first Q-enhancement buffer stage configured to enhance a Q-value of the first Q-deficient filter stage and isolate the first Q-deficient filter stage from the second filter stage using a single active device.

In another aspect of the disclosed embodiments, a receiver includes a filter circuit including a first Q-deficient filter stage and a second filter stage. The receiver further includes a first Q-enhancement buffer stage coupled therebetween with the first Q-enhancement buffer stage configured to enhance a Q-value of the first Q-deficient filter stage and isolate the first Q-deficient filter stage from the second filter stage using a single active device.

In another aspect of the disclosed embodiments, a wireless device includes an antenna and a receiver coupled to the antenna. The receiver includes a filter circuit including a first Q-deficient filter stage and a second filter stage. The receiver further includes a first Q-enhancement buffer stage coupled therebetween with the first Q-enhancement buffer stage configured to enhance a Q-value of the first Q-deficient filter stage and isolate the first Q-deficient filter stage from the second filter stage using a single active device.

In another aspect of the disclosed embodiments, a method for filtering includes filtering an input signal in a first Q-deficient filter stage and enhancing a deficient Q-value of the first Q-deficient filter stage with an active device. The method further includes buffering the first Q-deficient filter stage from any subsequent filter stage with the active device.

DETAILED DESCRIPTION

Figure 1:
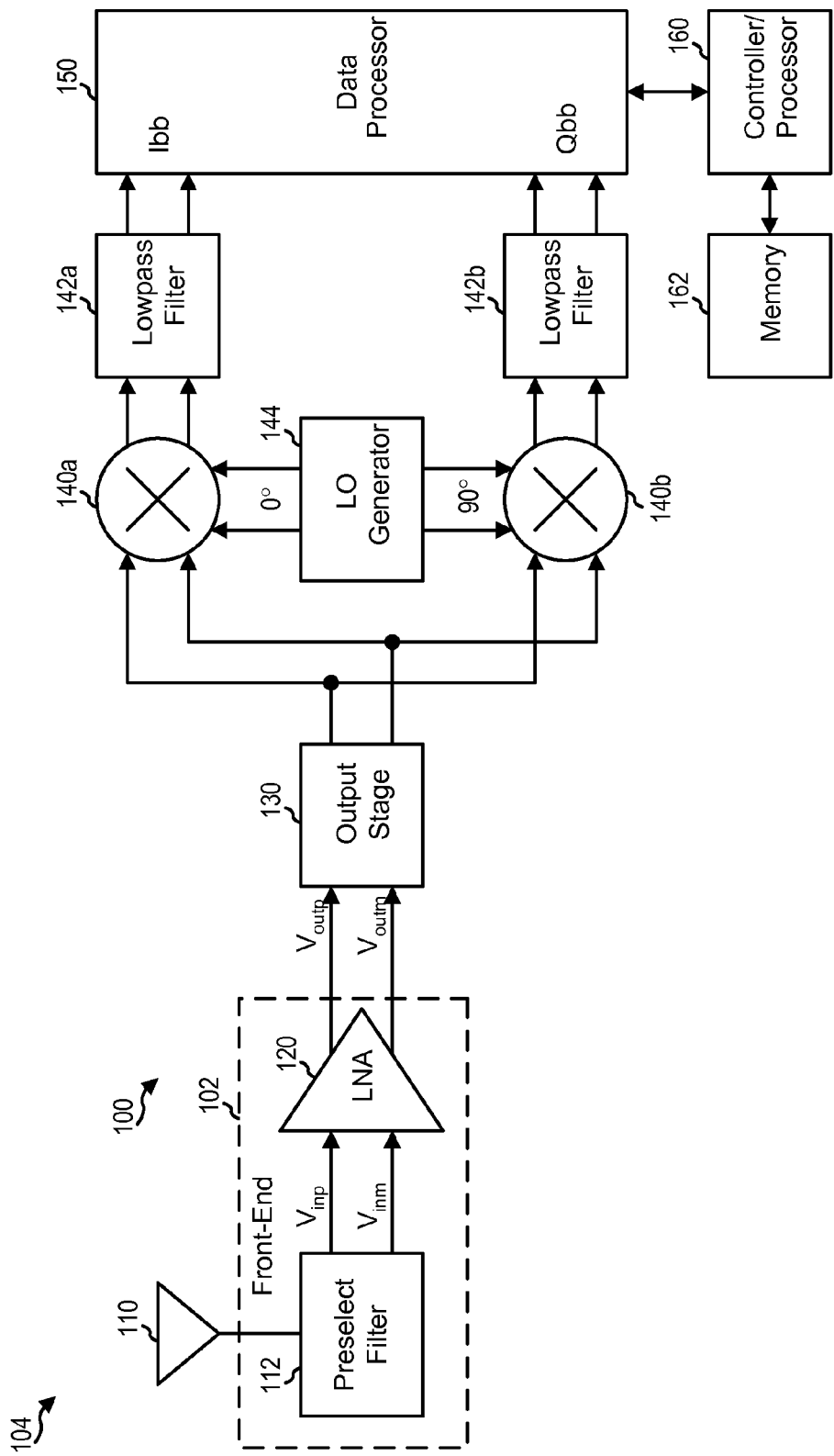
FIG. 1 illustrates a block diagram of a receiver.

Various embodiments are now described with reference to the drawings, wherein like reference numerals are used to refer to like elements throughout. In the following description, for purposes of explanation, numerous specific details are set forth in order to provide a thorough understanding of one or more embodiments. It may be evident, however, that such embodiment(s) may be practiced without these specific details. In other instances, well-known structures and devices are shown in block diagram form in order to facilitate describing one or more embodiments.

The word "exemplary" is used herein to mean "serving as an example, instance, or illustration." Any embodiment described herein as "exemplary" is not necessarily to be construed as preferred or advantageous over other embodiments.

Note that the exemplary embodiment is provided as an exemplar throughout this discussion, however, alternate embodiments may incorporate various aspects without departing from the scope of the present embodiments. Specifically, one embodiment is applicable to a data processing system, a wireless communication system, a mobile IP network and any other system desiring to receive and process a wireless signal.

Circuits and devices described herein may operate in wireless communication systems. Wireless communication systems are widely deployed to provide various types of communication such as voice, data, and so on. These systems may be based on Code Division-Multiple Access (CDMA), Time Division-Multiple Access (TDMA), or some other modulation techniques. A CDMA system provides certain advantages over other types of systems, including increased system capacity.

A wireless communication system, including the circuits and devices described herein, may be designed to support one or more standards such as the "TIA/EIA/IS-95-B Mobile Station-Base Station Compatibility Standard for Dual-Mode Wideband Spread Spectrum Cellular System" referred to herein as the IS-95 standard, the standard offered by a consortium named "3rd Generation Partnership Project" referred to herein as 3GPP, and embodied in a set of documents including Document Nos. 3GPP TS 25.211, 3GPP TS 25.212, 3GPP TS 25.213, and 3GPP TS 25.214, 3GPP TS 25.302, referred to herein as the W-CDMA standard, the standard offered by a consortium named "3rd Generation Partnership Project 2" referred to herein as 3GPP2, and TR-45.5 referred to herein as the cdma2000 standard, formerly called IS-2000 MC.

The circuits, devices, systems and methods described herein may be used with High Data Rate (HDR) communication systems. An HDR communication system may be designed to conform to one or more standards such as the "cdma2000 High Rate Packet Data Air Interface Specification," 3GPP2 C.S0024-A, Version 1, March 2004, promulgated by the consortium "3rd Generation Partnership Project 2." The contents of the aforementioned standard are incorporated by reference herein.

An HDR subscriber station, which may be referred to herein as an Access Terminal (AT), may be mobile or stationary, and may communicate with one or more HDR base stations, which may be referred to herein as Modem Pool Transceivers (MPTs). An access terminal transmits and receives data packets through one or more modem pool transceivers to an HDR base station controller, which may be referred to herein as a Modem Pool Controller (MPC). Modem pool transceivers and modem pool controllers are parts of a network called an access network. An access network transports data packets between multiple access terminals. The access network may be further connected to additional networks outside the access network, such as a corporate intranet or the Internet, and may transport data packets between each access terminal and such outside networks. An access terminal may be any data device that communicates through a wireless channel or through a wired channel, for example using fiber optic or coaxial cables. An access terminal may further be any of a number of types of devices including but not limited to PC card, compact flash, external or internal modem, or wireless or landline phone. The communication channel through which the access terminal sends signals to the modem pool transceiver is called a reverse channel. The communication channel through which a modem pool transceiver sends signals to an access terminal is called a forward channel.

The buffer with integrated filter-loss reduction, i.e., Q-enhancement, described herein may be used for various electronics devices such as receivers, cellular phones, personal digital assistants (PDAs), handheld devices, wireless modems, laptop computers, cordless phones, consumer electronics devices, etc. The buffer with integrated filter-loss reduction may also be used for various communication systems such as Code Division Multiple Access (CDMA) systems, Time Division Multiple Access (TDMA) systems, Frequency Division Multiple Access (FDMA) systems, Orthogonal FDMA (OFDMA) systems, Single-Carrier FDMA (SC-FDMA) systems, wireless local area networks (WLANs), broadcast systems, satellite positioning systems, etc. For clarity, the use of the buffer with integrated filter-loss reduction in a receiver is described below.

FIG. 1 illustrates a block diagram of a receiver 100. In this design, receiver 100 includes a receiver front-end 102 including a preselect filter 112 and an LNA 120. A receiver "front-end" may be variously defined to include other elements of a receiver including a mixer and local oscillator. A receiver may be implemented with a super-heterodyne architecture or a direct-conversion architecture. In the super-heterodyne architecture, a received signal is downconverted from radio frequency (RF) to baseband in multiple stages, e.g., from RF to an intermediate frequency (IF) in one stage, and then from IF to baseband in another stage. In the direct-conversion architecture, which is also referred to as a zero-IF architecture, a received signal is downconverted from RF to baseband in one stage. The super-heterodyne and direct-conversion architectures may use different circuit blocks and/or have different requirements. The following description assumes that receiver 100 implements the direct-conversion architecture.

In receiver 100, an antenna 110 receives transmitted signals from transmitting stations and provides a received signal to a receiver front-end 102 including a preselect filter 112 and an LNA 120. Preselect filter 112 may include one or more filters, wherein each filter may pass signal components in a designated frequency range and may be implemented with various resonator configurations.

In the design shown in FIG. 1, LNA 120 is a differential amplifier but may also be implemented as a single-ended amplifier. In general, the choice of single-ended or differential design for an LNA may be made based on system requirements and/or other considerations such as design complexity, power consumption, cost, etc. LNA 120 may amplify the differential LNA input signals $V_{inp}$ and $V_{inm}$ and provide a differential LNA output signal on lines $V_{outp}$ and $V_{outm}$.

An output stage 130 may receive the LNA output signal on line $V_{outp}$ and/or line $V_{outm}$ and may provide a differential conditioned signal to mixers 140a and 140b. Output stage 130 may include a balun for single-ended to differential conversion and one or more programmable attenuators, buffers, amplifiers, etc. Mixer 140a may downconvert the conditioned signal with an inphase (I) local oscillator (LO) signal from an LO generator 144 and provide an I downconverted signal. A lowpass filter 142a may filter the I downconverted signal and provide an I baseband signal (Ibb) to a data processor 150. Similarly, mixer 140b may downconvert the conditioned signal from output stage 130 with a quadrature (Q) LO signal from LO generator 144 and provide a Q downconverted signal. A lowpass filter 142b may filter the Q downconverted signal and provide a Q baseband signal (Qbb) to data processor 150.

LO generator 144 may generate the I and Q LO signals for mixers 140a and 140b, respectively. LO generator 144 may include one or more voltage controlled oscillators (VCOs), phase locked loops (PLLs), reference oscillators, etc.

In general, the conditioning of the signals in a receiver may be performed by one or more amplifiers, filters, mixers, etc. These circuit blocks may be arranged differently from the configuration shown in FIG. 1. Furthermore, other circuit blocks not shown in FIG. 1 may be used to condition the signals in the receiver. All or a portion of the receiver may be implemented on one or more RF integrated circuits (RFICs), mixed-signal ICs, etc.

Data processor 150 may include various processing units for data reception and other functions. For example, data processor 150 may include a digital signal processor (DSP), a reduced instruction set computer (RISC) processor, a central processing unit (CPU), etc. A controller/processor 160 may control the operation at receiver 100. Memory 162 may store program codes and data for receiver 100. Data processor 150, controller/processor 160, and/or memory 162 may be implemented on one or more application specific integrated circuits (ASICs) and/or other ICs.

The received signal from antenna 110 may include a desired signal as well as interfering signals, which may be from other communication systems. LNA 120 may amplify the received signal and provide an amplified signal via output stage 130 to mixers 140a and 140b. Mixers 140a and 140b may downconvert the amplified signal with LO signals having a fundamental frequency of $f_{LO}$, which may be the center frequency of the desired signal. The desired signal may then be downconverted to baseband by the fundamental frequency of the LO signals.

An interfering signal may be much larger than the desired signal and may be especially strong if the interfering signal comes from a transmitter that is co-located with receiver 100, which may be the case in a multi-purpose wireless device 104. A large interfering signal may interfere with the desired signal.

The potential adverse effect due to large interfering signals may be combated in several manners. The received signal may be filtered in preselect filter 112 prior to being passed to the LNA 120. In an aspect, the preselect filter 112 may be used to achieve good noise performance and to attenuate interfering signals that may degrade receiver performance. The preselect filter 112 and the LNA 120 may be designed to provide the desired noise performance for the receiver. The filter stages of the preselect filter and the LNA may be designed to provide the desired attenuation of the interfering signals. The preselect filter 112 and the LNA 120 may be implemented with various designs, as described below.

Figure 2:
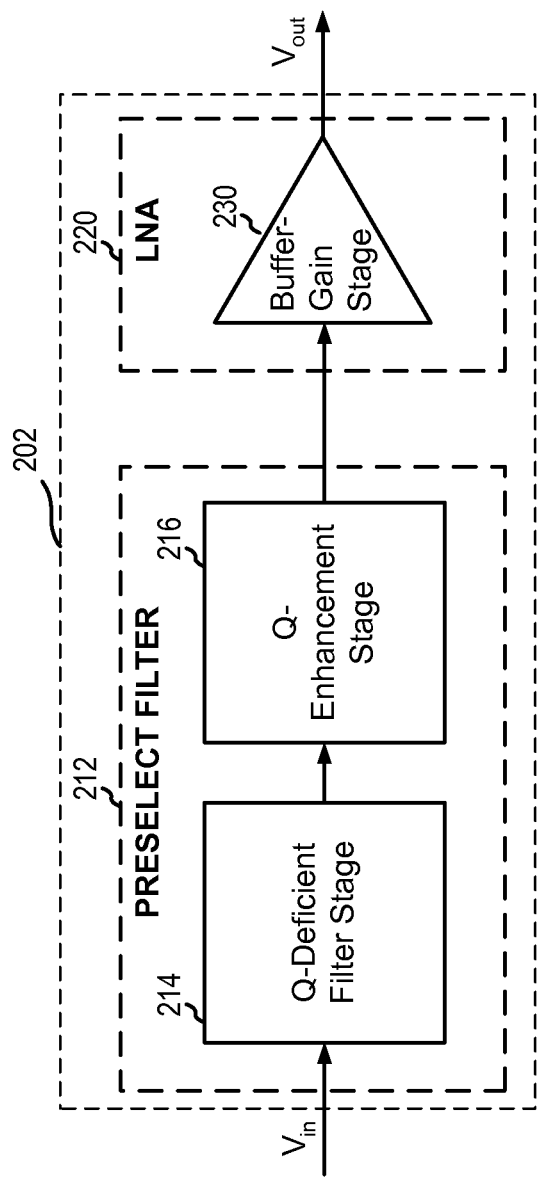
FIG. 2 illustrates a block diagram of a receiver front-end.

FIG. 2 illustrates a block diagram of a receiver front-end 202 including a single-ended preselect filter 212 with one Q-deficient, filter stage, and an LNA 220. For various reasons such as preservation of dynamic range on the receiver front-end, preselect filter 212 may be implemented using passive components such as inductors and capacitors to form a resonator. Preselect filter 212 is designed to pass the desired signals relatively unfiltered and to attenuate the undesired signals. The effectiveness of signal selection by a preselect filter 212 is determined by the Q-value of a filter stage. Generally larger components in a filter stage may provide an adequate Q-value for providing the desired passband filtering. Conventionally, if the Q-value is inadequate, then larger, higher Q-value components may be substituted until the filter stage provides adequate signal rejection.

As communication receivers become portable and mobile, various components in the receiver front-end are reduced in size and subjected to a corresponding reduction in performance. Design tradeoffs exist between reduction in component size in a receiver front-end, such as a filter stage configured as a passband filter, and the reduction in the effectiveness or quality of signal selection and rejection based upon the reduction of the Q-value of the filter stage components.

Preselect filter 212 may be used for preselect filter 112 in FIG. 1. The preselect filter 212 includes a passive bandpass filter stage, illustrated in FIG. 2 as a Q-deficient filter stage 214. The Q-deficient filter stage 214 may be configured as a resonator including a capacitor C, an inductor L and a representative resistive inductive loss Rp. In practical implementations of mobile or portable receivers, passive bandpass filters, such as Q-deficient filter stage 214, are implemented according to mass-produced passive components such as capacitors and inductors, electromagnetic resonators or acoustic resonators of reduced dimensions and tolerances. Reduced dimensions and tolerances of bandpass filter stage components, including integrated circuit-based components, results in a Q-deficient filter stage 214. A Q-deficient filter stage 214 exhibits inadequate passband selection and out-of-band rejection of the RF input signal, as well as high loss.

Conventionally, the Q-value of passive bandpass filter stages could be adequately increased based upon selection of higher Q-value capacitors and inductors or large resonate cavities, albeit of larger dimensions. However, in portable and mobile devices for example, the Q-value of a Q-deficient filter stage 214 may be augmented by a Q-enhancement stage 216. In one aspect, the Q-enhancement stage 216 is coupled in parallel to the representative resistive inductive loss resistor Rp of the Q-deficient filter stage 214. The Q-enhancement stage 216 may be configured as a negative resistor for compensating for the resistive inductive loss resistor Rp. The Q-enhancement stage 216 may be implemented as a transconductance active device. LNA 220 may be used for LNA 120 in FIG. 1. LNA 220 includes a buffer/gain stage 230 to receive an LNA input signal $V_{in}$ from line $V_{inp}$ or $V_{inm}$ and amplify the LNA input signal with a fixed or variable gain to provide an amplified signal.

Figure 3:
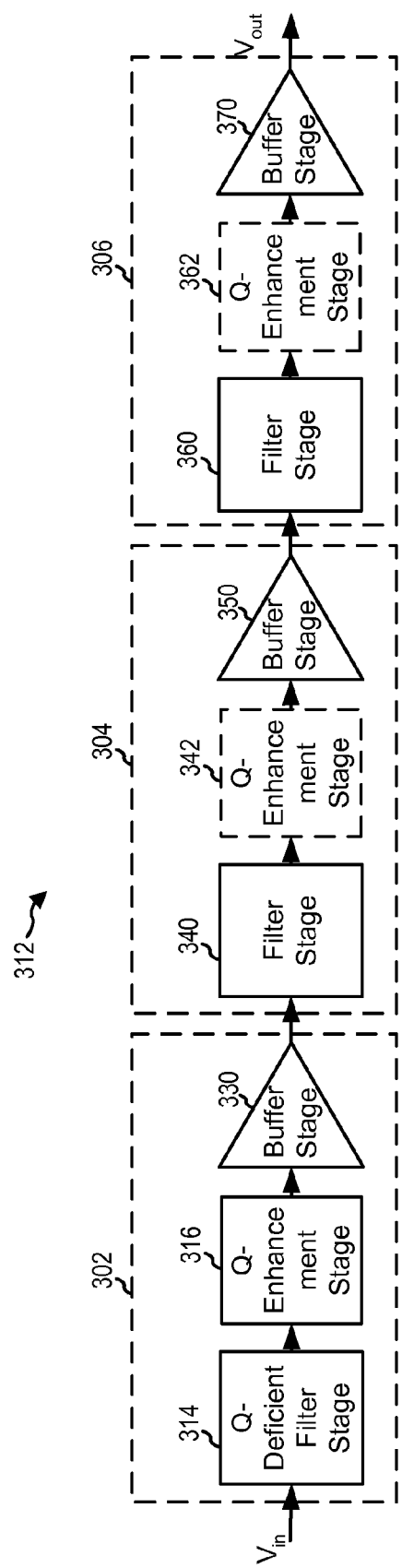
FIG. 3 illustrates a block diagram of a filter including multiple buffered filtering stages.

FIG. 3 illustrates a block diagram of a filter 312 including multiple buffered filtering stages including, for example, three buffered filtering stages 302, 304 and 306. Filter 312 may also be used for preselect filter 112 in FIG. 1. Filter 312 includes at least one Q-deficient filter stage illustrated as first Q-deficient filter stage 314 and a first Q-enhancement stage 316, as described above. Filter 312 further includes additional stages for providing additional filter poles to improve the passband frequency. These additional stages are isolated by a buffer stage in order to facilitate cascading of additional filter stages. Accordingly, filter 312 further includes first buffer stage 330 for isolating the first Q-deficient filter stage 314 from subsequently cascaded filter stages.

Filter 312 may include one or more further buffered filtering stages 304 and 306 illustrated in FIG. 3. A second buffered filtering stage 304 includes a second filter stage 340 and a second buffer stage 350. A third buffered filtering stage 306 may include a third filter stage 360 and a third buffer stage 370. Second filter stage 340 and third filter stage 360 may be "Q-adequate" or "Q-deficient" filter stages. When either or both of the second filter stage 340 or third filter stage 360 are Q-deficient filter stages, then filter 312 may respectively further include second Q-enhancement stage 342 and third Q-enhancement stage 362.

While filtering described herein has been described with respect to a receiver-front end, filter 312 is not so limited. Specifically, the various buffered filtering stages described herein find application to any filter configuration where filter stages exhibit a Q-deficient condition. Specifically, filter stages implemented on integrated circuits frequently exhibit Q-deficient characteristics and can benefit from Q-enhancement techniques across multiple stages.

Figure 4:
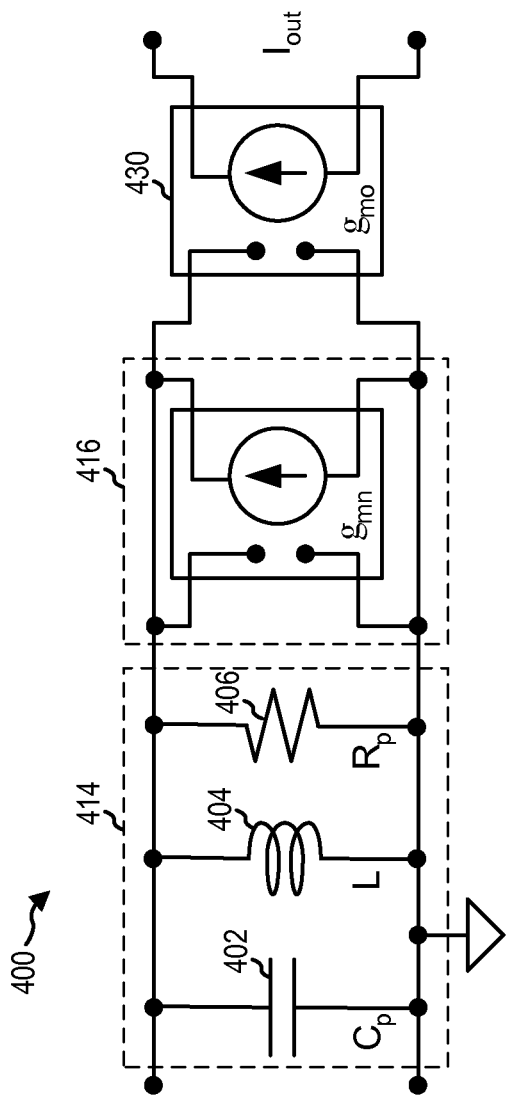
FIG. 4 illustrates circuit diagram of a filtering stage including a Q-deficient filter stage, a Q-enhancement stage and a buffer stage as described in FIG. 2 and FIG. 3.

FIG. 4 illustrates circuit diagram of a buffered filtering stage 400 including a Q-deficient filter stage 414, a Q-enhancement stage 416 and a buffer stage 430 as described in FIG. 2 and FIG. 3. A Q-deficient filter stage 414 includes a capacitor C 402, an inductor L 406 including a resistive inductive loss illustrated as resistor Rp 408. In practical implementations of mobile or portable receivers, passive bandpass filters, such as Q-deficient filter stage 414, is implemented according to mass-produced passive components, such as capacitors and inductors of reduced dimensions and tolerances, or other resonator elements resulting in a Q-deficient filter stage exhibiting inadequate passband selection and out-of-band rejection of the RF input signal including high loss.

The Q-deficient filter stage 414 couples to a Q-enhancement stage 416 coupled in parallel to the resistive inductive loss resistor Rp 406 of the Q-deficient filter stage 414. The Q-enhancement filter stage 416 may be configured as a negative resistor for compensating for the resistive inductive loss resistor Rp 406. The Q-enhancement filter stage 416 may be implemented as a transconductance active device as illustrated. The Q-enhancement stage 416 further couples to a buffer stage 430 to provide isolation with subsequent filter stages.

As noted in FIG. 4, isolation between a filter stage utilizing Q-enhancement and a successive filter stage requires at least one active element in the Q-enhancement stage 416, a second active element to in the buffer stage 430. Accordingly, each active element in a receiver consumes bias current resulting in undesired power consumption. Accordingly, a reduction in active devices consuming power is desirable.

Figure 5:
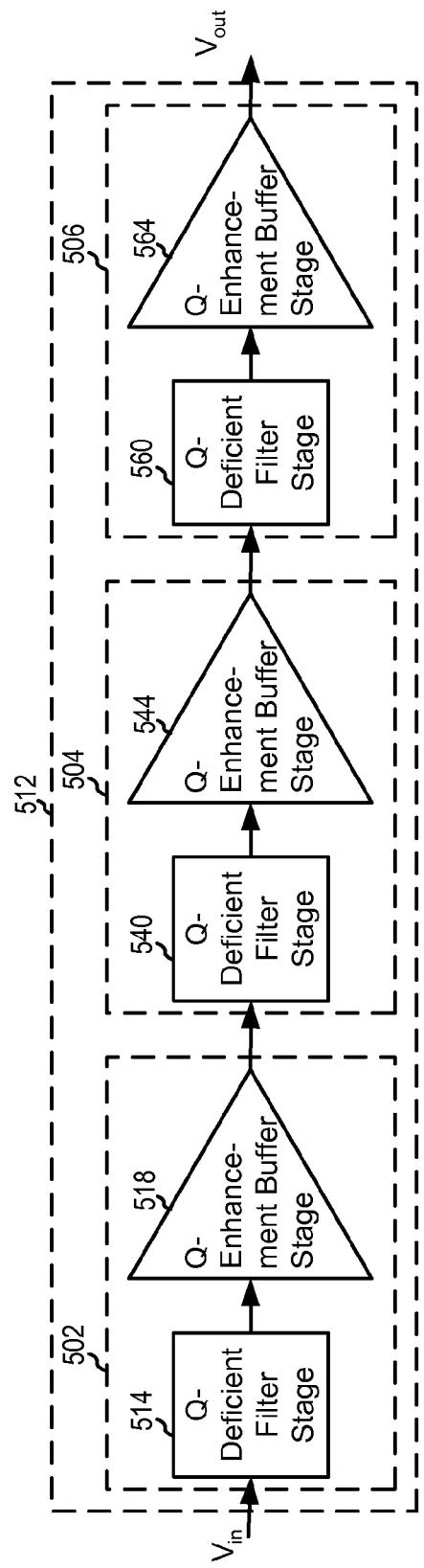
FIG. 5 illustrates a block diagram of a filter including multiple buffered filtering stages including an integrated Q-enhancement buffer stage.

FIG. 5 shows a block diagram of a design of a filter 512 including one or more buffered filtering stages 502, 504 and 506, according to an aspect of the disclosed embodiments. Filter 512 may be used for preselect filter 112 or find other applications, such as integrated circuit filters, or any other filters where at least one filter stage is a Q-deficient filter stage that is augmented by a Q-enhancement stage. FIG. 5 illustrates a three buffered filtering stages 502, 504 and 506 forming filter 512. Filter 512 includes at least one Q-deficient filter stage illustrated as first Q-deficient filter stage 514 and a first Q-enhancement buffer stage 518. Filter 512 further includes additional buffered filtering stages for providing additional filter poles to improve the frequency response. These additional buffered filtering stages are also isolated by a Q-enhanced buffer stage in order to cascade the buffered filtering stages. FIG. 5 illustrates an additional buffered filtering stages 504 and 506 including second filter stage 540 and third filter stage 560. As noted, first Q-enhancement buffer 518 provides both Q-enhancement and isolates first Q-deficient filter stage 514 from subsequent filter stages. Similarly, a Q-enhancement buffer 544 also provides both Q-enhancement and isolates a second Q-deficient filter stage 540 from subsequent filter stages. Additionally, a third Q-enhancement buffer 564 also provides both Q-enhancement and isolates a third Q-deficient filter stage 560 from any subsequent filter stages (not shown).

Figure 6:
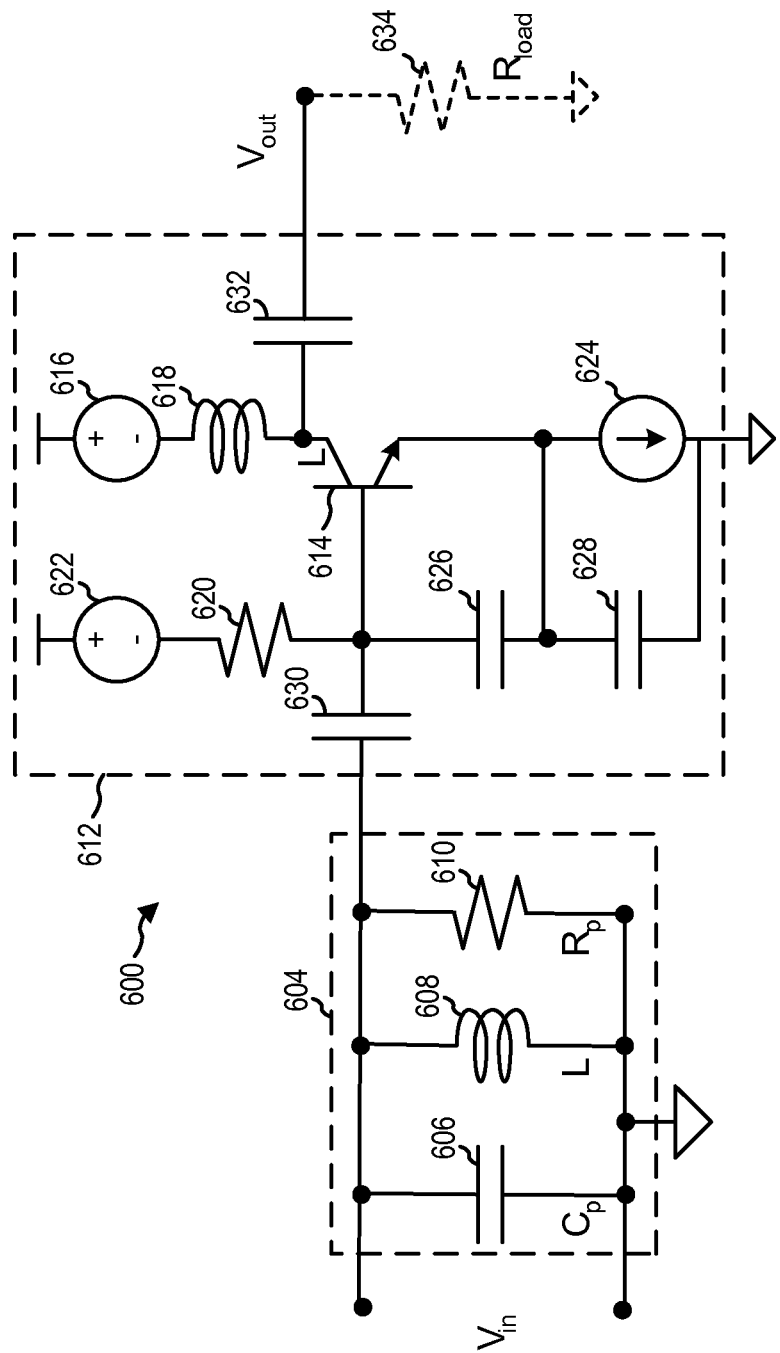
FIG. 6 illustrates a circuit diagram of a buffered filtering stage including an integrated Q-enhancement buffer stage.

FIG. 6 illustrates a circuit diagram of a single buffered filtering stage 600 including a Q-deficient filter stage 604 coupled to a Q-enhancement buffer stage 612, according to an aspect of the various disclosed embodiments. A Q-enhancement buffer stage 612 provides the functionality of both a Q-enhancement stage and a buffer stage using a single active element, illustrated as transistor 614. Accordingly, a single buffered filtering stage 600 includes, for example, a Q-deficient filter stage 604 to receive an input signal The Q-deficient filter stage 604 may be a resonator and may include different components including discrete inductors, capacitors, transmission lines, cavity resonators and acoustic resonators. The Q-deficient filter stage 604 is illustrated to include a capacitor C 606, an inductor L 608 including a resistive resonator loss illustrated as resistor Rp 610. The Q-deficient filter stage 604 is illustrated as including only passive elements which provide a high dynamic range for filtering the entire RF input signal but may include filter elements on an integrated circuit that also form a Q-deficient filter stage.

It is noted that in mobile or portable devices including receivers, the reduction in physical dimensions of filter circuit components results in a reduction in the "Q-value" of the filter resulting from the filter circuit components. Accordingly, realization of reduced-dimension bandpass filters results in a reduction in the Q-value of the filters. As stated, one method for increasing the Q-value of a Q-deficient passive bandpass filter is to mitigate the resistive losses in the passive components of the passive bandpass filter by providing a negative resistance. Accordingly, buffered filtering stage 600 further includes a Q-enhancement buffer stage 612 coupled in parallel to the resistive inductive loss resistor Rp 610 of the Q-deficient filter stage 604. The Q-enhancement buffer stage 612 may be configured as a negative resistor for compensating for the resistive inductive loss resistor Rp 610 and may be further configured to provide an isolated output for buffering between filter stages. The Q-enhancement buffer stage 612 may be implemented as a transconductance active device as illustrated in FIG. 6 with an isolated output.

The Q-enhancement buffer stage may be variously configured. In one aspect, Q-enhancement buffer stage 612 is configured as a negative resistance to cancel the effect of losses, such as resistive inductive loss illustrated as resistor Rp 610 with an isolated collector terminal on the active device, illustrated herein as transistor 614. Positive feedback from Q-enhancement buffer stage 612 reduces the effect of losses in resonator loss resistance Rp 610. The amount of positive feedback is controlled by the ratio of capacitors 626 and 628 with the Q-value being determined by the feedback provided by the capacitors 626 and 628 as well as the current following through transistor 614. The losses of inductor 608 and capacitor 606 are modeled by the inductor loss resistance Rp 610.

In one aspect, the Q-enhancement buffer stage 612 is configured as a negative resistance circuit arranged in a modified Colpitts configuration. The Q-enhancement buffer stage 612 includes a transistor 614 having a collector coupled to a power source 616 via a collector-isolating inductor 618. A first bias resistor 620 is coupled between a power source 622 and the base terminal of the transistor 614. A current source 624 is coupled between the emitter terminal of the transistor 614 and a ground potential. A first feedback capacitor 626 is coupled between the base and emitter terminals of the transistor 614. A second feedback capacitor 628 is coupled between the emitter terminal of the transistor 614 and the ground potential. Q-enhancement buffer stage 612 further includes a coupling capacitor 630 for coupling an input signal $V_{in}$ to a base terminal of the transistor 614.

The collector terminal of the transistor 614 provides gain at an output of the Q-enhancement buffer stage as the output is decoupled from the power source 616 by way of an inductor 618. Inductor 618 provides isolation between the collector terminal and the power source 616 in order to provide buffering to a next stage through a coupling apacitor 632. In operation, an AC input signal $V_{in}$ causes the emitter terminal to track the input signal $V_{in}$. The collector terminal draws the alternating emitter current through an output of the Q-enhancement buffer stage 612 which is coupled to a next stage, illustrated as $R_{load}$ 634.

In general, a filter may include any number of filter stages, any number of Q-enhancement buffer stages, and/or other stages. The number of stages may be dependent on system requirements and/or other considerations such as design complexity, silicon area, power consumption, etc. Each Q-enhancement buffer stage may provide a fixed gain or a variable gain. Each filter stage may have a suitable filter response. If multiple filter stages are present, then the frequency responses of these filter stages may be determined (i) jointly to achieve a desired overall filter response or (ii) independently for each stage without regard to the other stages. The overall filter response may be an elliptical filter response, a Chebyshev filter response, etc. A buffer stage may be inserted between filter stages, after the last filter stage, etc.

Figure 7:
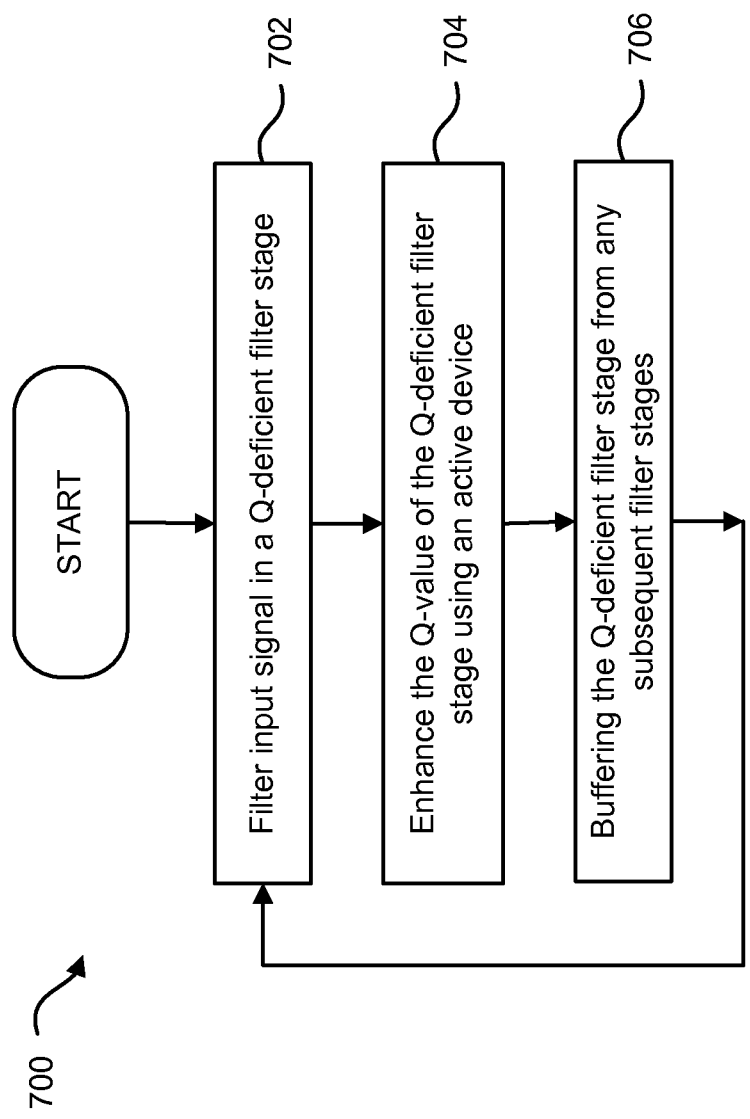
FIG. 7 is a flowchart of a process for filtering according to an integrated Q-enhancement buffer stage.

FIG. 7 is a flowchart of a process for filtering according to an integrated Q-enhancement buffer stage according to at least some aspects of the embodiments discussed herein. A process 700 illustrates enhancing a devicient Q-value and concurrently buffering successive filtering stages. In step 702, an input signal is received and is filtered in a Q-deficient filter stage. The Q-deficient filter stage includes only elements which result in a deficient Q-value for the desired filtering process. Such elements may include reduced-size or low-tolerance passive discrete elements or filter elements formed on integrated circuits.

In step 704, the Q-value of the Q-deficient filter stage is enhanced using a Q-enhancement circuit. As stated, in mobile or portable devices including receivers, the reduction in physical dimensions of filter circuit components results in a reduction in the narrowness of the bandwidth or Q-value of the filter resulting from the filter circuit components. Accordingly, realization of reduced-dimension bandpass filters results in a reduction in the Q-value of the filters. The Q-value is increased by mitigating the resistive losses in the passive components of the passive bandpass filter by providing a negative resistance. Accordingly, a Q-enhancement circuit is coupled in parallel to the resistive inductive loss resistor of the Q-deficient filter stage. In step 706, the Q-deficient filter stage is buffered or isolated from any subsequent filter stages using the same active device that is used to provide the Q-enhancement.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A filter circuit, comprising:
a first buffered filtering stage including
a first Q-deficient filter stage to receive an input signal; and
a first Q-enhancement buffer stage coupled to-the first Q-deficient filter stage, wherein the first Q-enhancement buffer stage includes a single active device to increase a Q-value of the first Q-deficient filter stage and isolate the first Q-deficient filter stage from any subsequent filter stage.

2. The circuit of claim 1, wherein the first Q-deficient filter stage comprises a resonator configured as one of an LC tank circuit, transmission lines, cavity resonators and acoustic resonators.

3. The circuit of claim 1, wherein the first Q-enhancement buffer stage includes an inductor isolating a collector terminal of the single active device from a power source.

4. The circuit of claim 1, further comprising a second buffered filtering stage including a second filtering stage coupled to the first Q-enhancement buffer stage and isolated from the first Q-deficient filtering stage by the first Q-enhancement buffer stage.

5. The circuit of claim 4, wherein the second filtering stage is a second Q-deficient filter stage and the second filtering stage further includes a second Q-enhancement buffering stage coupled to the second Q-deficient filter stage to increase a Q-value of the second Q-deficient filter stage and isolate the second Q-deficient filter stage from any subsequent filtering stage.

6. The circuit of claim 5, wherein the first buffered filtering stage and the second buffered filtering stage form a respective first pole and a second pole of the filter circuit.

7. The circuit of claim 1, wherein the first Q-enhancement buffer stage is formed as an integrated circuit.

8. The circuit of claim 1, wherein the first Q-deficient filter stage is formed as an integrated circuit.

9. A filter circuit, comprising:
a first Q-deficient filter stage;
a second filter stage; and
a first Q-enhancement buffer stage coupled therebetween,
the first Q-enhancement buffer stage configured to enhance a Q-value of the first Q-deficient filter stage and isolate the first Q-deficient filter stage from the second filter stage using a single active device.

10. The circuit of claim 9, wherein the first Q-enhancement buffer stage is configured as a negative resistance to enhance the Q-value of the first Q-deficient filter stage.

11. The circuit of claim 10, wherein a collector terminal of the active device is isolated from a power source of the first Q-enhancement buffer stage.

12. The circuit of claim 9, wherein the first Q-deficient filter stage and the second filter stage form a respective first pole and a second pole of the filter circuit.

13. A receiver, comprising:
   a filter circuit including:
      a first Q-deficient filter stage;
      a second filter stage; and
      a first Q-enhancement buffer stage coupled therebetween, the first Q-enhancement buffer stage configured to enhance a Q-value of the first Q-deficient filter stage and isolate the first Q-deficient filter stage from the second filter stage using a single active device.

14. The receiver of claim 13, wherein the filter circuit is part of a receiver front-end and the first Q-deficient filter stage comprises a resonator configured as one of an LC tank circuit, transmission lines, cavity resonators and acoustic resonators.

15. The receiver of claim 13, wherein the first Q-deficient filter stage comprises at least one of an integrated circuit configured as one of an inductor and a capacitor.

16. A wireless device, comprising:
   an antenna; and
   a receiver coupled to the antenna, the receiver including a filter circuit including:
      a first Q-deficient filter stage;
      a second filter stage; and
      a first Q-enhancement buffer stage coupled therebetween, the first Q-enhancement buffer stage configured to enhance a Q-value of the first Q-deficient filter stage and isolate the first Q-deficient filter stage from the second filter stage using a single active device.

17. A method, comprising:
   filtering an input signal in a first Q-deficient filter stage;
   enhancing a deficient Q-value of the first Q-deficient filter stage with an active device; and
   buffering the first Q-deficient filter stage from any subsequent filter stage with the active device.

18. The method of claim 17, further comprising isolating the active device from a power source during the enhancing and the buffering.

19. A circuit, comprising:
   means for filtering an input signal in a first Q-deficient filter stage;
   means for enhancing a deficient Q-value of the first Q-deficient filter stage with an active device; and
   means for buffering the first Q-deficient filter stage from any subsequent filter stage with the active device.

20. The circuit of claim 19, further comprising means for isolating the active device from a power source during the enhancing and the buffering.

* * * * *